(12) United States Patent
Lu

(10) Patent No.: US 10,025,587 B2
(45) Date of Patent: Jul. 17, 2018

(54) METHOD OF BOOTUP AND INSTALLATION, AND COMPUTER SYSTEM THEREOF

(71) Applicant: American Megatrends Inc., Norcross, GA (US)

(72) Inventor: Yuan-Heng Lu, Taipei (TW)

(73) Assignee: AMERICAN MEGATRENDS INC., Norcross, GA (US)

( * ) Notice: Subject to any disclaimer, the term of this patent is extended or adjusted under 35 U.S.C. 154(b) by 106 days.

(21) Appl. No.: 15/238,763

(22) Filed: Aug. 17, 2016

(65) Prior Publication Data

US 2018/0052679 A1 Feb. 22, 2018

(51) Int. Cl.
 *G06F 8/65* (2018.01)
 *G11C 7/10* (2006.01)
 *G06F 9/4401* (2018.01)

(52) U.S. Cl.
 CPC .............. *G06F 8/66* (2013.01); *G06F 9/4401* (2013.01); *G11C 7/1072* (2013.01)

(58) Field of Classification Search
 CPC .......... G06F 8/66; G06F 9/401; G11C 7/1072
 USPC ........................................................ 717/168
 See application file for complete search history.

(56) References Cited

U.S. PATENT DOCUMENTS

| | | | | |
|---|---|---|---|---|
| 8,468,334 | B1* | 6/2013 | Jonna | G06F 9/4403 713/1 |
| 2009/0319763 | A1* | 12/2009 | Zimmer | G06F 9/4401 713/1 |
| 2014/0359270 | A1* | 12/2014 | Raj | G06F 9/45558 713/2 |
| 2016/0004542 | A1* | 1/2016 | Das | G06F 9/4405 713/2 |
| 2016/0019106 | A1* | 1/2016 | Ali | G06F 11/0727 714/6.23 |

* cited by examiner

*Primary Examiner* — Anna Deng
(74) *Attorney, Agent, or Firm* — McClure, Qualey & Rodack, LLP

(57) ABSTRACT

A computer system includes a processor unit, a storage device, and a memory is provided. The storage device stores an image file containing a loader component, a RAM disk component, and an OS kernel component. The memory stores instructions executable by the processor unit which, when executed, cause the computer system to identify the loader component, load the loader component into a first location in the memory, and execute the loader to cause retrieval and loading of the RAM disk component and the OS kernel component respectively into a second location and a third location within the memory.

10 Claims, 8 Drawing Sheets

METHOD OF BOOTUP AND INSTALLATION, AND COMPUTER SYSTEM THEREOF

BACKGROUND

1. Technical Field

The present disclosure generally relates to a method of a system bootup and installation, and computer system thereof; particularly, the present disclosure relates to a method and computer system for installation and bootup of a system based on a single image file under the UEFI framework.

2. Description of the Related Art

Traditionally, computing systems may boot to an operating system. The boot up of the operating system is typically handled by a low level instruction code that is used as an intermediary between the hardware components of the computing system and the operating software and other high level software executing on the computing system. This low level instruction code is often known as the Basic Input/Output System ("BIOS") firmware and provides a set of software routines that allow high level software to interact with the hardware components of the computing system. The firmware performs routines for conducting Power-On Self Test ("POST") each time the computing system is powered on in order to test and initiate all hardware components in the computing system before handing off control to the operating system. These hardware components may include the system main memory, disk drives, and keyboards.

However, as technology has progressed with many devices such as peripheral devices advancing towards being wireless or cordless, boot up firmwares based on the traditional BIOS standard, which was originally designed for personal computers of International Business Machine Corporation (IBM), have become a point of restriction or limitation as to what the boot up firmware may control with respect to hardware and subsequently what hardware the Operating System may control. As new hardware and software technologies were being developed, this source of restriction became a major obstacle in the hardware-software interaction. As a result, a new standard of BIOS firmware has been proposed and widely adopted by many major industry leaders. This new standard is called the Unified Extensible Firmware Interface (UEFI).

With the adoption of UEFI standards, BIOS companies were able to produce UEFI firmware for computing systems, while companies producing Operating Systems were able to take advantage of the services these UEFI firmware provided by producing UEFI compliant Operating Systems. When manufacturers or companies want to update and/or revise the firmware or Operating System of a particular computing system or device, the typical routine entails a lengthy process where the computing device's firmware and/or Operating System is patched. In other cases, the process would require the user to have technical knowledge in order to assist in the installation of the new patches. This is a time consuming and complicated process. However, in modern times, as the number of different objects are being embedded with processing power and simultaneously given networking capabilities have exponentially increased, the scale of difficulty in updating or revising the firmware and/or Operating Systems of all the devices would be near impossible or practical through the traditional method.

Therefore, there is a need to reduce the installation complexities and frustrations of the users in the updating methods of the firmware and Operating systems of networked devices.

SUMMARY

It is an objective of the present disclosure to provide a computing system and a method thereof having an UEFI firmware architecture that can support installation and bootup of operating systems based on a single image file.

According to one aspect of the invention, a computer system includes a processor unit, a storage device, and a memory. The storage device stores an image file containing a loader component, a RAM Disk component, and an OS kernel component. The memory stores instructions executable by the processor unit which, when executed, cause the computer system to identify the loader component, load the loader component into a first location in the memory, and execute the loader component to cause retrieval and storage of the RAM Disk component and the OS kernel component from the image file into a second location and a third location respectively of the memory.

According to another aspect of the invention, a computer-implemented method includes performing computer-implemented operations for: storing an image file containing a loader component, a RAM Disk component, and an OS kernel component into a storage device; identifying the loader component; loading the loader component into a first location of a memory; and executing the loader component to retrieve and store the RAM Disk component and the OS kernel component from the image file into a second location and third location respectively of the memory.

DETAILED DESCRIPTION OF THE PREFERRED EMBODIMENT

Embodiments of the present invention provide methods and systems for the installing and/or updating of firmware or Operating System based on a single image file. In the following detailed description, references are made to the accompanying drawings that form a part hereof, and in which are shown by way of illustration specific embodiments or examples. These embodiments are only illustrative of the scope of the present invention, and should not be construed as a restriction on the present invention. Referring now the drawings, in which like numerals represent like elements through the several figures, aspects of the present invention and the exemplary operating environment will be described.

The present disclosure provides a computing system and method thereof for installing and/or updating of loader or Operating System based on a single image file. Preferably, the computer system includes (but not limited to) laptop computers, personal computers, computer servers, handheld computing devices such as mobile telephones and tablet computers, wearable computing devices, and/or any object with embedded processing power that has networking capabilities that would be classified as an IoT (Internet of Things) device.

Figure 1:
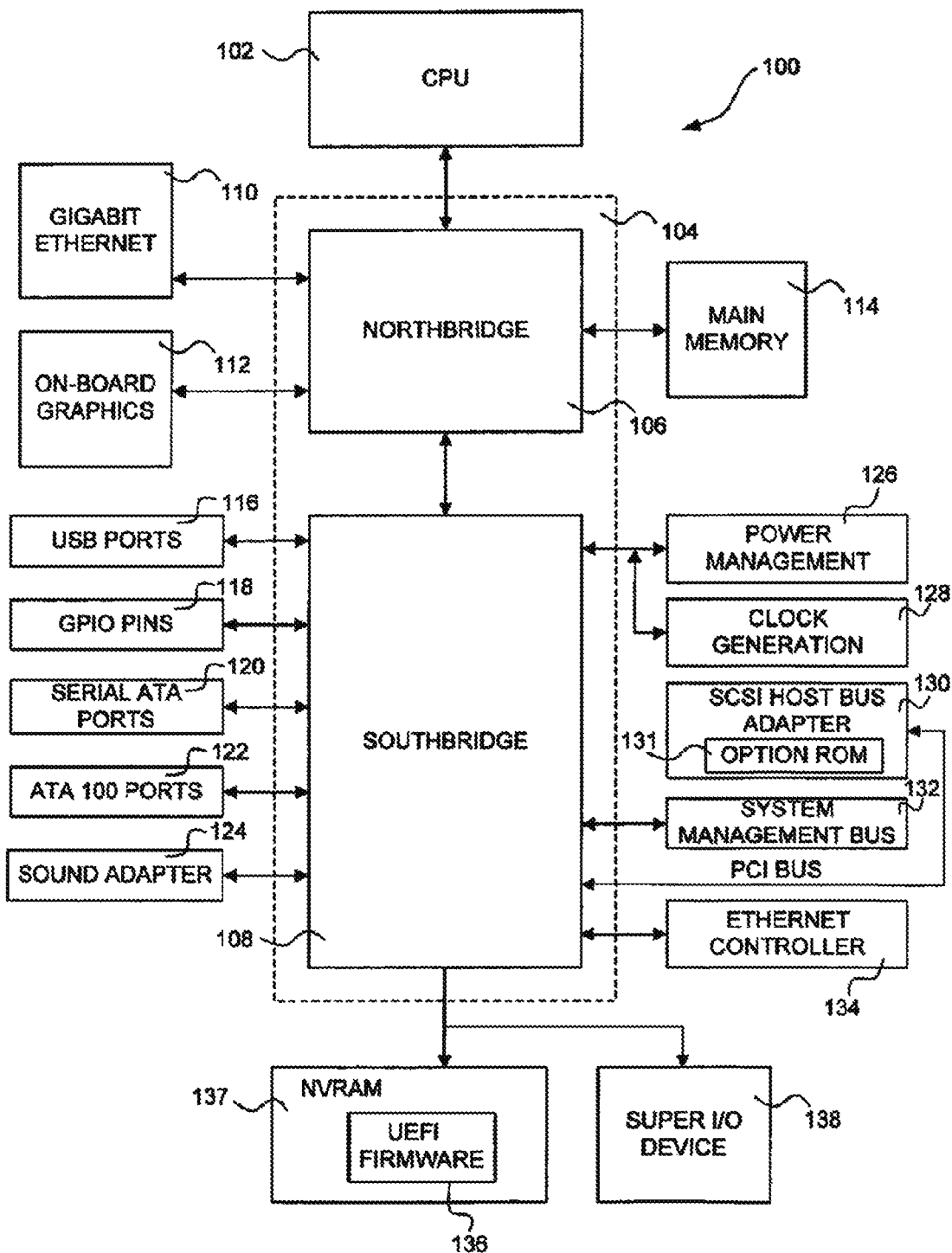
FIG. 1 is a view of an embodiment of the computer system.

FIG. 1 and the following discussion are intended to provide a brief, general description of a suitable computing environment in which the invention may be implemented. However, those skilled in the art will recognize that the invention may also be implemented in other suitable computing environments. Moreover, those skilled in the art will appreciate that the invention may also be practiced with other computer system configurations, including multiprocessor systems, microprocessor-based or programmable consumer electronics, minicomputers, mainframe computers, and the like. The invention may also be practiced in distributed computing environments where tasks are performed by remote processing devices that are linked through a communications network.

Referring to FIG. 1, an illustrative computer architecture for practicing the embodiments discussed herein will be described. It should be appreciated that although the embodiments described herein are discussed in the context of a conventional desktop or server computer, the embodiments may be utilized with virtually any type of computing device. For instance, any physical objects—devices, vehicles, buildings, and other items that may constitute or be part of a network of Internet of Things (IoT)—embedded with electronics, software, sensors, and network connectivity may benefit from the boot architecture of the present invention. FIG. 1 shows an illustrative computer architecture for a computer system 100 that is operative to initiate an operating system boot from firmware. The blocks of FIG. 1 are intended to represent functional components of the computer architecture and are not intended to necessarily represent individual physical components. Functional components described may be combined, separated, or removed without departing from the overall sense and purpose of the computer architecture.

In order to provide the functionality described herein, the computer system 100 includes a baseboard, or "motherboard", which is a printed circuit board to which a multitude of components or devices may be connected by way of a system bus or other communication path. In one illustrative embodiment, a central processing unit (CPU) 102 operates in conjunction with a chipset 104. The CPU 102 may be a standard central processor that performs arithmetic and logical operations necessary for the operation of the computer. The CPU 102, in this and other embodiments, may include one or more of a microprocessor, a microcontroller, a field programmable gate array (FPGA), a complex programmable logic device (CPLD), an application specific integrated circuit (ASIC), and/or any other electronic computing device.

The chipset 104 includes a northbridge 106 and a southbridge 108. The northbridge 106 provides an interface between the CPU 102 and the remainder of the computer system 100. The northbridge 106 also provides an interface to one or more random access memories (RAM) used as a main memory 114 in the computer system 100 and, possibly, to an on-board graphics adapter 112. The northbridge 106 may also enable networking functionality through a gigabit Ethernet adapter 110. The gigabit Ethernet adapter 110 is capable of connecting the computer system 100 to one or more other computers via a network. Connections that may be made by the adapter 110 may include local area network (LAN) or wide area network (WAN) connections, for example. LAN and WAN networking environments are commonplace in offices, enterprise-wide computer networks, intranets, and on the Internet. The northbridge 106 is connected to the southbridge 108.

The southbridge 108 is responsible for controlling many of the input/output functions of the computer system 100. In particular, the southbridge 108 may provide one or more universal serial bus (USB) ports 116, a sound adapter 124, an Ethernet controller 134, and one or more general purpose input/output (GPIO) pins 118. The southbridge 108 may also provide a bus for interfacing peripheral card devices such as a BIOS boot specification (BBS) compliant SCSI host bus adapter 130. In one embodiment, the bus comprises a peripheral component interconnect (PCI) bus. The southbridge 108 may also provide a system management bus 132 for use in managing the various components of computer system 100. Power management circuitry 126 and clock generation circuitry 128 may also be utilized during operation of the southbridge 108.

The southbridge 108 is also operative to provide one or more interfaces for connecting mass storage devices to the computer system 100. For instance, according to an embodiment, the southbridge 108 includes a serial advanced technology attachment (SATA) adapter for providing one or more serial ATA ports 120 and an ATA100 adapter for providing one or more ATA100 ports 122. The serial ATA ports 120 and the ATA100 ports 122 may be, in turn, connected to one or more mass storage devices storing an operating system, application programs, and other data. As known to those skilled in the art, an operating system comprises a set of programs that control operations of a computer and allocation of resources. An application program is software that runs on top of the operating system software, or other runtime environment, and uses computer resources to perform application specific tasks desired by a user of the computer system 100.

The mass storage devices connected to the southbridge 108 and the SCSI host bus adapter 130, and their associated computer-readable media, provide non-volatile storage for the computer system 100. Although the description of computer-readable media contained herein refers to a mass storage device, such as a hard disk or CD-ROM drive, it should be appreciated by those skilled in the art that computer-readable media can be any available media that can be accessed by the computer system 100. By way of example, and not limitation, computer-readable media may include computer storage media and communication media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, HD-DVD, BLU-RAY, or other optical storage, magnetic cassettes, magnetic tape, magnetic disk storage or other magnetic storage devices, or any other medium which can be used to store the desired information and which can be accessed by the computer.

A low pin count (LPC) interface may also be provided by the southbridge 108 for connecting a Super I/O device 138. The Super I/O device 138 is responsible for providing a number of input/output ports, including a keyboard port, a mouse port, a serial interface, a parallel port, and other types of input/output ports. The LPC interface or another interface may be utilized to connect a computer storage medium such as a ROM or a non-volatile random access memory (NVRAM) 137 such as a flash memory. The computer storage medium may be used for storing the firmware 136 that includes modules containing instructions and data that help to startup the computer system 100 and to transfer information between elements within the computer system 100. However, in other different embodiments, the firmware 136 may be stored in any other areas in the computer system 100.

The firmware 136 may include program code that is compatible with the UEFI specification. It should be appreciated that in addition to the firmware 136 including an UEFI-compatible firmware, other types and combinations of firmware may be included. For instance, the firmware 136 may include additionally or alternatively a BIOS firmware and/or other type of firmware known to those in the art. Additional details regarding the operation of the UEFI firmware 136 are provided below with respect to the subsequent diagrams. It should be appreciated that the computer system 100 may not include all of the components shown in FIG. 1, may include other components that are not explicitly shown in FIG. 1, or may utilize an architecture completely different than that shown in FIG. 1.

Figure 2:
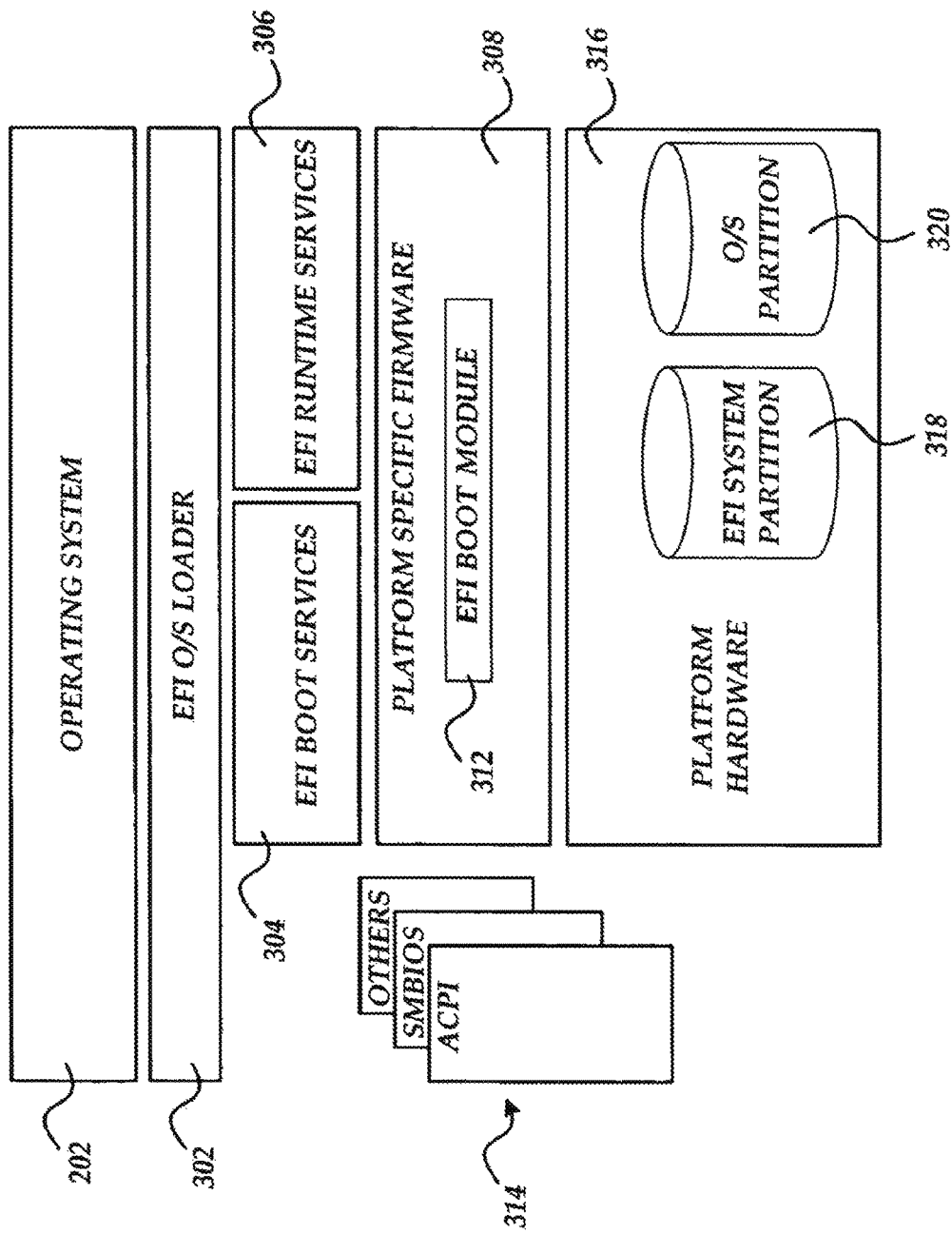
FIG. 2 is a view of an UEFI specification-compliant system.

Referring to FIG. 2, additional details regarding an UEFI specification-compliant system that may be utilized to provide an operating environment for the various implementations presented herein will be described. As shown in FIG. 2, the system includes platform hardware 316 and operating system (OS) 202. A platform specific firmware 308 may retrieve OS program code from the EFI system partition 318 using an OS loader 302, sometimes referred to as a boot loader or an OS boot loader. Likewise, the OS loader 302 may retrieve OS program code from other locations, including from attached peripherals or from the firmware 136 itself. The EFI system partition 318 may be an architecturally shareable system partition. As such, the EFI system partition 318 defines a partition and file system that are designed to allow safe sharing of mass storage between multiple vendors. An OS partition 320 may also be utilized.

Once started, the OS loader 302 continues to boot the complete operating system 202, potentially loading the operating system in stages, as with the GRUB, commonly associated with Linux operating systems. The OS loader 302 may use EFI boot services 304 and interface to other supported specifications to survey, comprehend, and initialize the various platform components and the operating system 202 software that manages them. Thus, interfaces 314 from other specifications may also be present on the system. For example, the Advanced Configuration and Power Management Interface (ACPI) and the System Management BIOS (SMBIOS) specifications may be supported.

EFI boot services 304 provide interfaces for devices and system functionality that can be used during boot time. EFI runtime services 306 are available to the OS loader 302 during the boot phase and to an operating system 202 when it is running. For example, runtime services may be presented to ensure appropriate abstraction of base platform hardware resources that may be needed by the operating system 202 during its normal operation. EFI allows extension of platform firmware by loading EFI drivers and EFI application images which, when loaded, have access to all EFI-defined runtime and boot services. Once the EFI firmware is initialized, it passes control to the EFI boot module 312.

Figure 3:
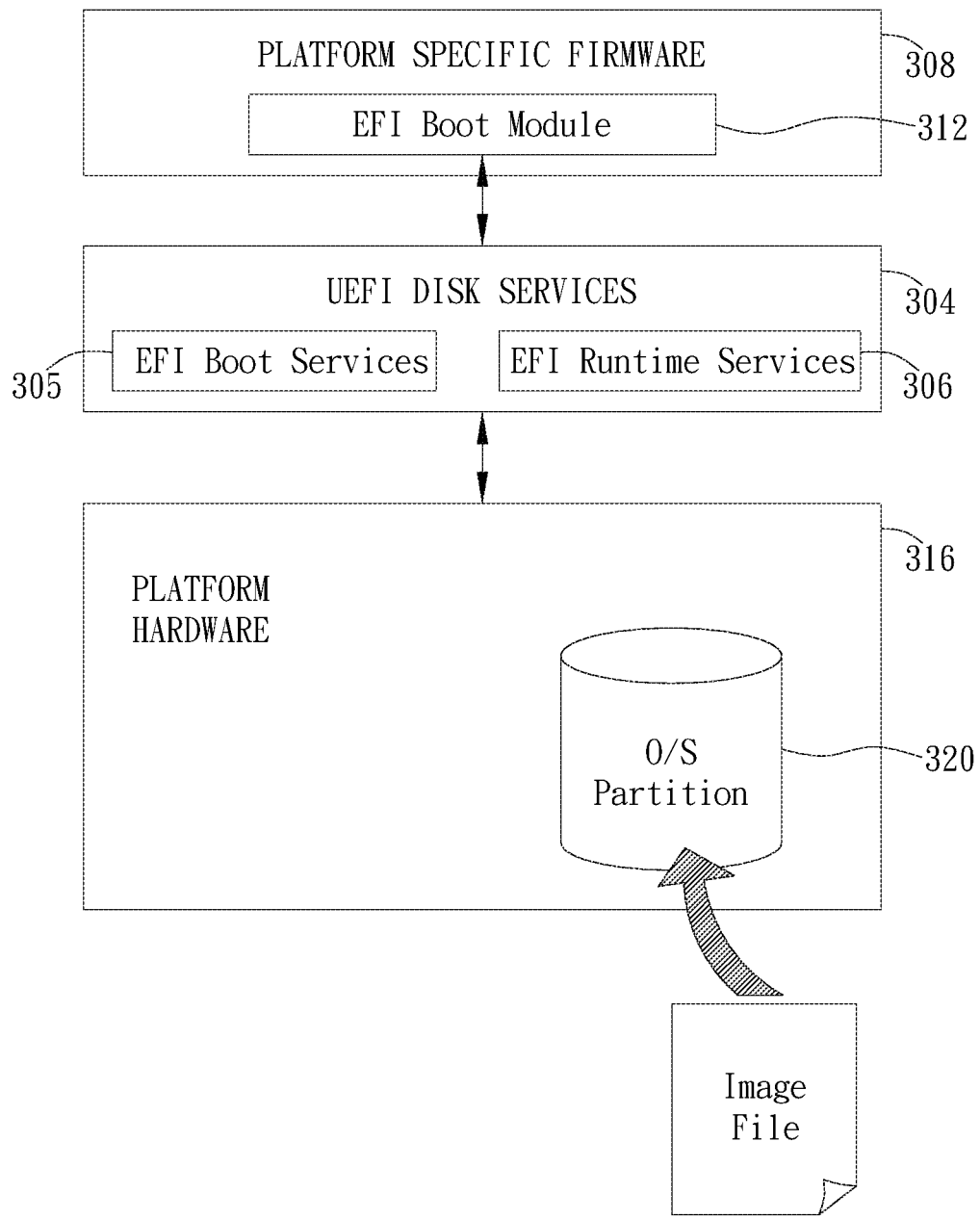
FIG. 3 is a view of an embodiment of the EFI boot module initiating installation and bootup from a single image file.

Referring to FIG. 3, details are shown to illustrate the process by which the computer system may be induced or prompted to disregard the load up of the operating system code in the EFI system partition 318. Instead, the EFI boot module 312 may first scan to see if an image file 322 for installation of a new Operating System is stored in the storage device O/S partition 320 of the platform hardware 316.

In one embodiment, the image file 322 may be received through the internet and stored in the O/S partition 320, wherein upon the subsequent restart of the computer system, the EFI boot module 312 may then perform the scan in the O/S partition 320 to find the stored image file 322.

In another embodiment, the firmware or the running Operating System of the computer system may initiate or be prompted to initiate updating procedures by connecting with a remote source on the internet to download the image file 322 into the O/S partition 320. For instance, the manufacturer or provider of the computer system may remotely instruct that the computer system be updated. In this circumstance, the manufacturer can instruct or prompt the computer system to download the image file into the O/S partition 320 such that upon subsequent restart of the computer system, the EFI boot module 312 would be able to find the image file 322 when the scan on the O/S partition 320 is performed.

Figure 4:
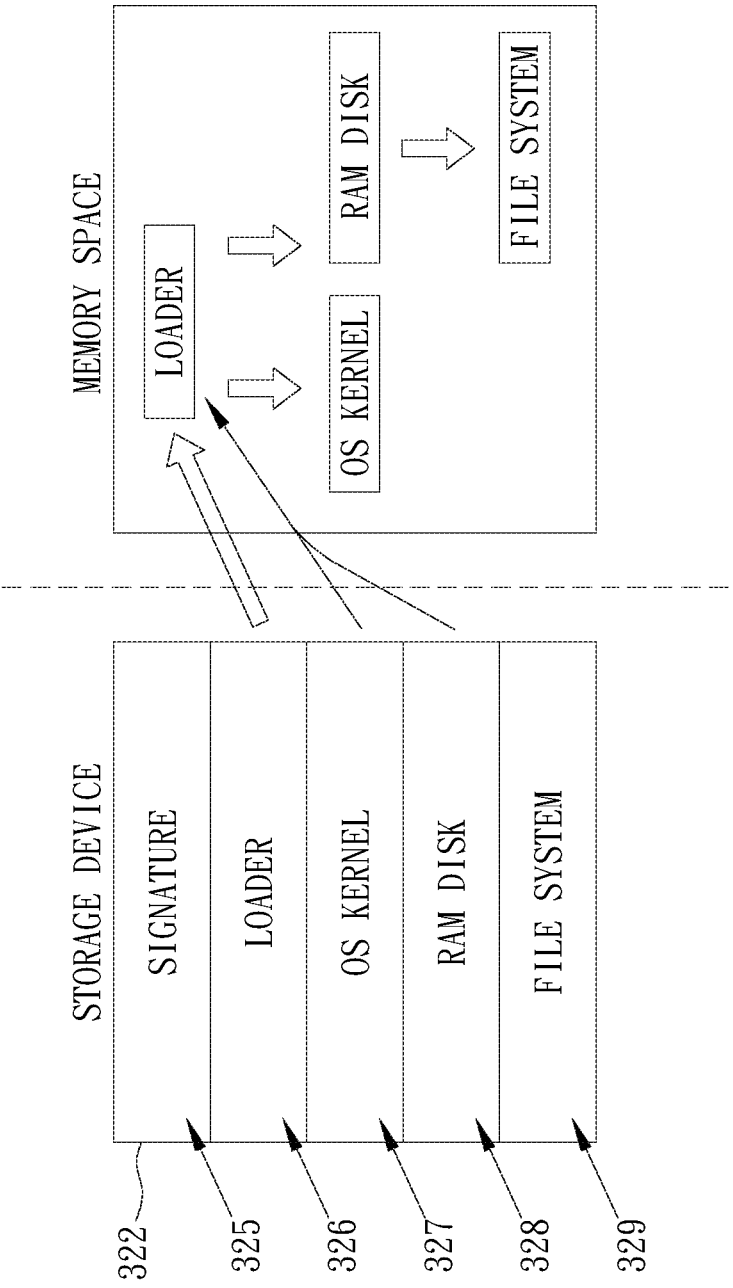
FIG. 4 is a view of an embodiment of the computer system executing the loader component of the image file.

When the EFI boot module 312 finds that the image file is in the O/S partition 320, the EFI boot module 312 can utilize the UEFI Disk services 304 to read the image file 322. Referring to FIGS. 3 and 4, in the present embodiment, the image file 322 is stored in the O/S partition 320 (storage device) and consists of various different components of code. In one embodiment, the image file 322 includes (but not limited) signature component 325, loader component 326, OS kernel component 327, RAM Disk component 328, and file system component 329. When the EFI boot module 312 scans and finds the image file 322 in the O/S partition 320, the EFI boot module 312 will utilize the UEFI disk services 304 to access and load the loader component 326 into the memory (memory space) of the computer system and cause the computer system to subsequently execute the code contained within the loader component 326.

In the present embodiment, the loader component 326 is an EFI format loader, wherein its processes are then loaded into the memory space by the EFI boot module 312 through the UEFI disk services 304. When the loader processes/instructions are executed in the memory space, the loader processes will retrieve the OS kernel component 327 and the RAM Disk component 328 such that these components can then be subsequently loaded into different places in the memory space. For instance, if the loader was loaded into a first location in the memory space, the OS kernel component 327 and the RAM Disk component 328 may be subsequently loaded respectively into a second location and a third location in the memory space.

In one embodiment, the RAM Disk component 328 includes essential files necessary to support and permit a real file system to be mounted on the computer system. These files may include drivers, executable components, and any other support files. In other embodiments, any number of optional components may be included with the RAM Disk component 328, such as language support files. With the RAM Disk component loaded into the memory space, the RAM Disk can then subsequently mount the file system 329 into the memory space. After the OS kernel component 329 loads the OS Kernel component 327 into the memory, the loader will cause the computer system to execute the OS kernel to start up the new Operating System.

Figure 5:
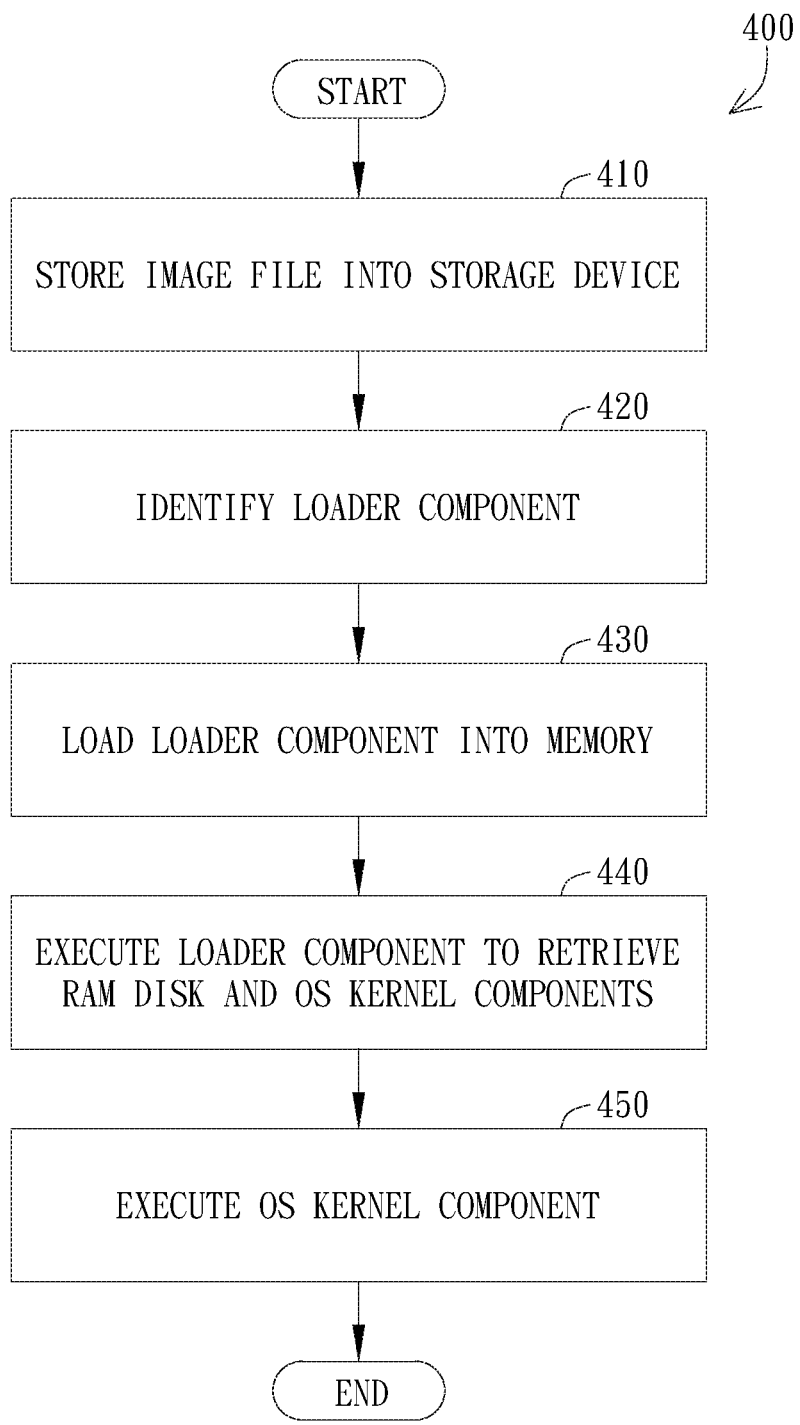
FIG. 5 is a flowchart of installing and/or updating the firmware or Operating System based on the single image file.

FIG. 5 is an embodiment of the computer-implemented method of installation of new loader or Operating System based on the single image file. As shown in FIG. 5, the method 400 includes steps 410 to 450. As discussed above, the image file 322 is stored in the O/S partition 320 of the storage device of platform hardware 316. When the computer system is started up, the EFI boot module 312 of the platform specific firmware 308 will scan the O/S partition 320 to find the image file 322, wherein the EFI boot module 312 will execute step 420 of identifying the loader component 326 in the image file 322. At this point, the EFI boot module 312 will then load the loader component 326 into memory in step 420, and then proceed to step 440 of executing the loader component that is loaded into the memory. In step 440, upon execution, the loader in the memory will retrieve and load the RAM Disk component 328 and the OS kernel component 327 from the image file 322 into the memory space, wherein step 450 will then entail executing the OS kernel loaded in the memory to start the new Operating System.

Figure 6A:
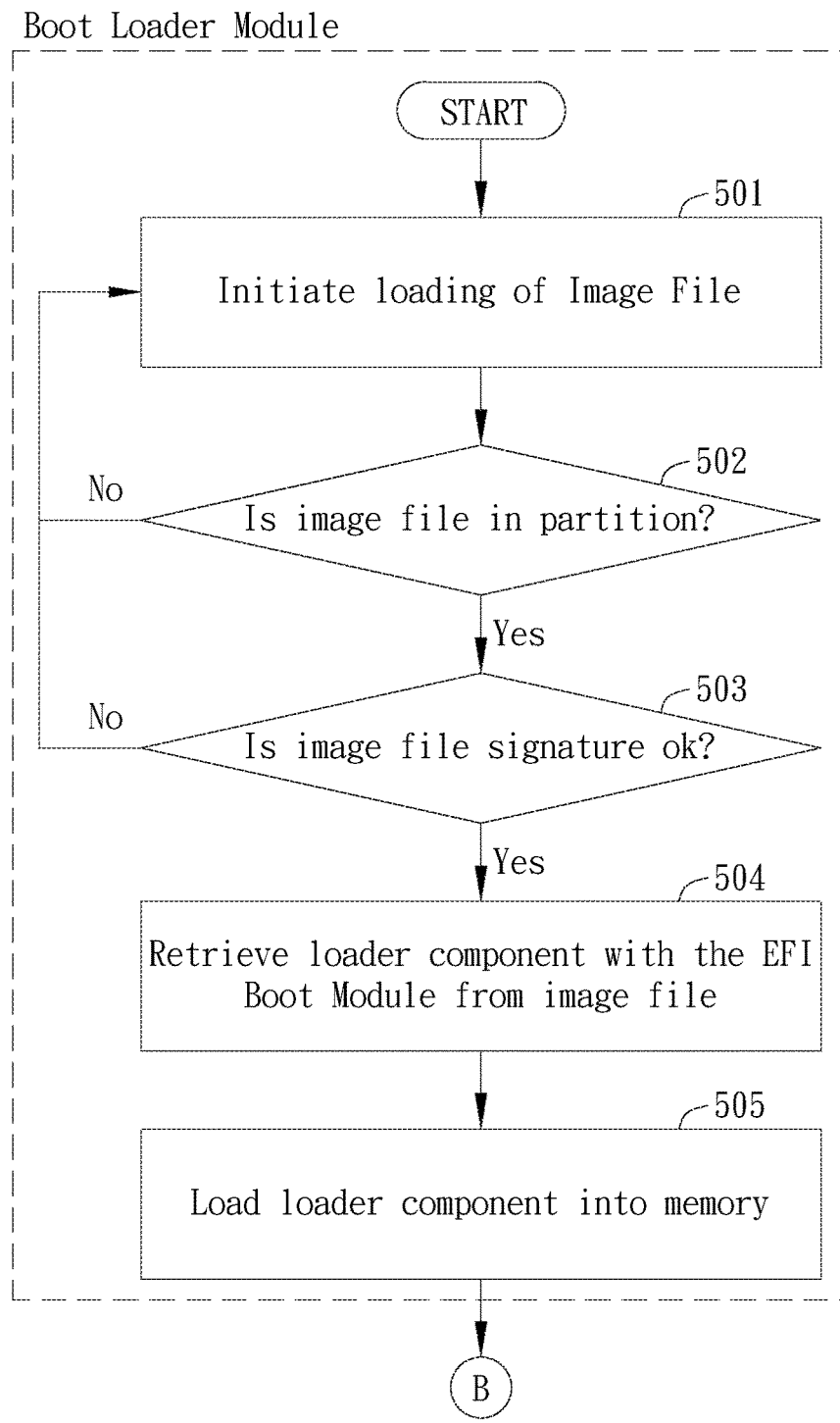
FIG. 6A is a flowchart of the process in FIG. 5 when running in the EFI boot module.
Figure 6B:
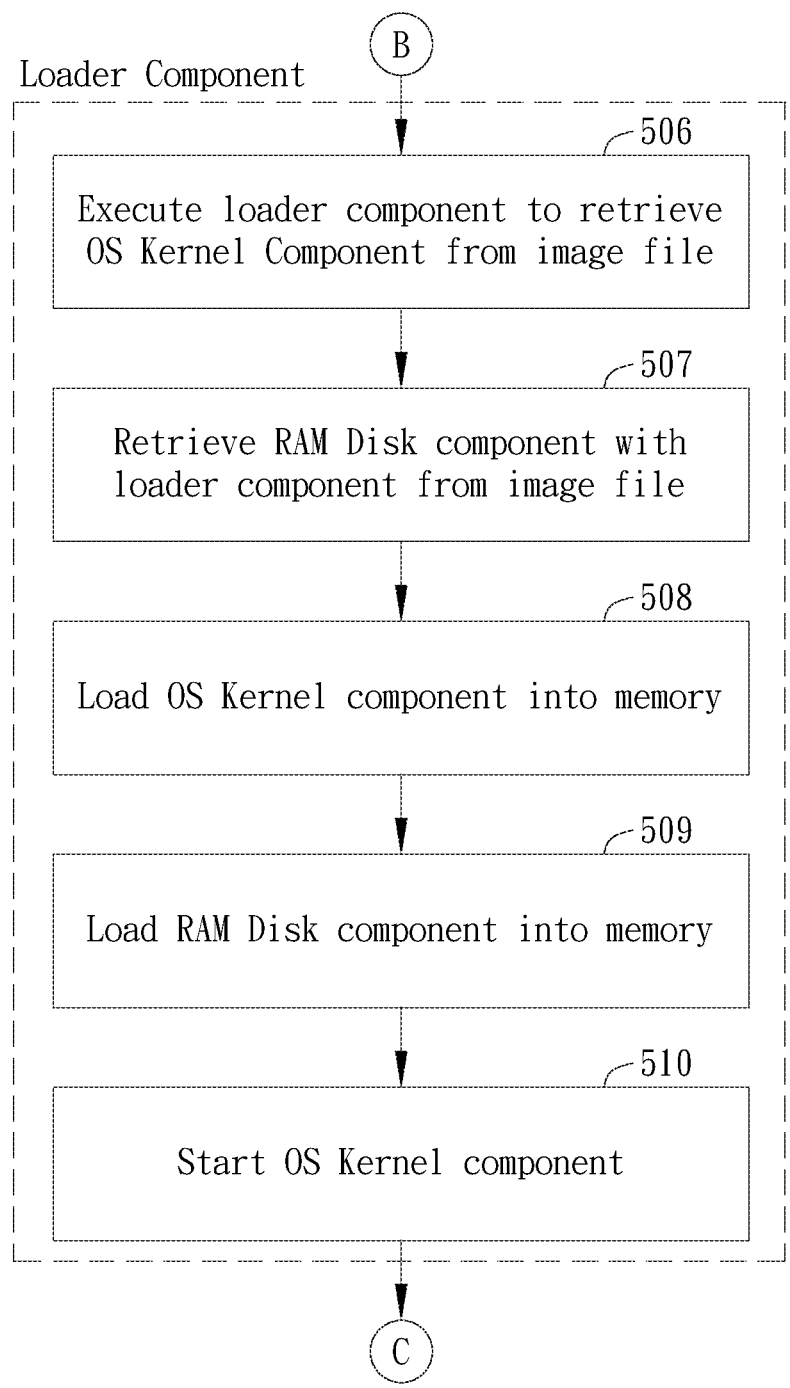
FIG. 6B is a continuation of the process in FIG. 6A when the process subsequently runs through the loader component in the memory space.
Figure 6C:
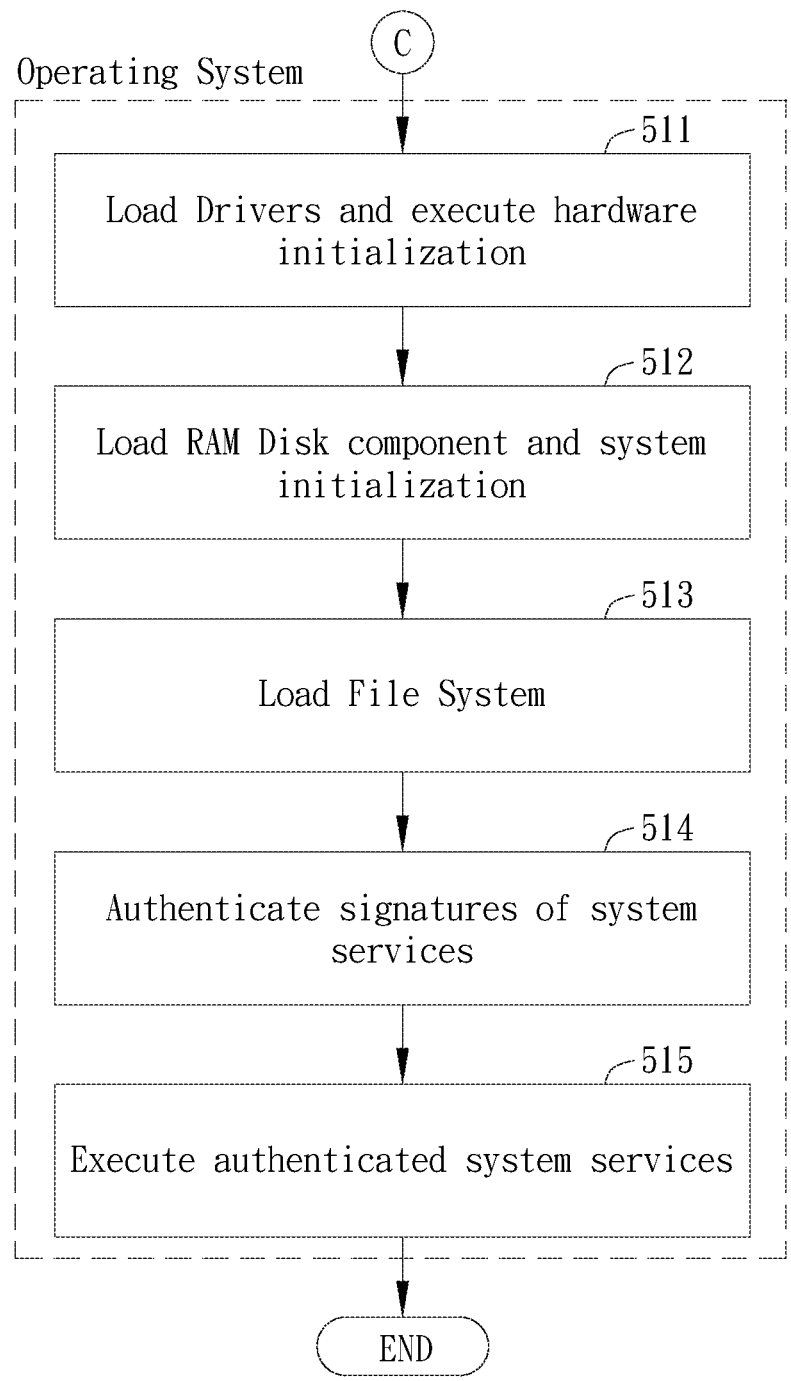
FIG. 6C is a continuation of the process in FIG. 6B when the process starts the initialization of the Operating System.

FIGS. 6A-6C illustrate another detailed flowchart of the method described in FIG. 5. Referring to FIG. 6A, steps 501 to 505 are executed by the EFI boot module 312 once the EFI boot module 312 discovers there is an image file 322 in the O/S partition 320 or discovers that the original image file originally in the O/S partition 320 has been changed to the image file 322.

As illustrated in FIG. 6A, step 501 includes initiating loading of the image file 322. In the present embodiment, when the EFI boot module 312 discovers the image file 322 in the O/S partition 320 of the storage device of the platform hardware 316, the EFI boot module 312 will start the procedure of initiating the loading of the image file 322 to the memory space of the computer system. The EFI boot module 312 will first confirm in step 502 whether the file(s) in the O/S partition 320 is an image file of an Operating System. Next, when the EFI boot module 312 has confirmed that the image file 322 in the O/S partition 320 is an image file of an Operating System, the EFI boot module 312 will then proceed to step 503 of checking the signature of the image file 322.

In the present embodiment, the image file 322 will include a signature component 325. When this signature component 325 is authenticated to be correct by the EFI boot module 312, the image file 322 will be deemed by the EFI boot module 312 to be safe and authenticated for use and implementation into the computer system. After the authentication step performed in step 503, the EFI boot module 312 will then proceed to step 504 of retrieving the loader component 326 in the image file 322.

In step 504, the EFI boot module 312 will by default know the location of the loader component 326 in the image file 322. The EFI boot module 312 will then proceed to retrieve the loader component 326 at that specific location in the image file 322. However, in other different embodiments, the EFI boot module 312 may not necessarily know in advance the location of the loader component 326 in the image file 322. In this circumstance, the EFI boot module 312 can scan the image file 322 and identify the loader component 326, wherein the EFI boot module 312 will then retrieve the loader component 326 and proceed to step 505 of loading the loader component 326 into the memory (memory space).

Referring to FIG. 6B, the loader component 326 is loaded into the memory space, and the procedure proceeds to step 506 of executing the loader component that is loaded in the memory space. The loader, once executed by the computer system, retrieves the RAM Disk component 328 from the image file 322. In the present embodiment, the location of the RAM Disk component 328 within the image file 322 is only known to the loader. In other words, if the loader component 326 is not first decoded from the image file 322 and loaded into the memory space beforehand, the location of the RAM Disk component 328 would not be known. In this manner, a level of security is provided by the present invention since only genuine and authenticated image files 322 would perform or be executed properly. Similarly, in the next step 507, the loader in the memory space will proceed to retrieve the OS kernel component 327 from the image file 322, wherein the location of the OS kernel component 327 within the image file 322 is similarly only known to the loader.

After retrieving the OS kernel component 327 and the RAM Disk component 328, these components are respectively loaded into the memory space in steps 508 and 509 at a second and third location within the memory space with respect to the first location that the loader is located in the memory. Then, step 510 is performed to start the OS kernel that is loaded in the memory space.

The method then proceeds to FIG. 6C where step 511 is performed under the environment for the new Operating System. Step 511 includes loading drivers and executing hardware initialization. Next, the RAM Disk is loaded and system initialization is performed in step 512, wherein the file system is then loaded in step 513. Step 514 then authenticates the signatures of the system services, and then the authenticated system services are executed in step 515 to complete the procedure.

As seen in the method and computer system above, since the computer system can read and install a new Operating System from a single image file that is copied into its O/S partition, the present invention provides a novel way to allow easy and fast distribution of new updates to networked devices. For instance, software patches or updates for several thousands or millions of IoT (Internet of Things) devices can be performed very fast and succinctly since only a single file need be distributed to each device. This reduces on the amount of files that would need to be transferred to each device, which then leads to a decrease in the amount of bandwidth needed to transfer the updates to those devices. At the same time, the installation time and the complexities of the installation is greatly reduced, which reduces the amount of input needed by the user during the installation process and decreases the frustration levels generally experienced by the users. Additionally, since the locations of the OS kernel component and the RAM Disk components within the image file is only known to the loader component, the present invention provides an additional layer of security to prevent malicious code from being executed.

Although the embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A computer-implemented method comprising performing computer-implemented operations for:
   storing into a storage device an image file containing a loader component, a RAM disk component, and an OS kernel component;
   identifying the loader component;
   loading the loader component into a first location of a memory; and
   executing the loader component loaded in the memory to retrieve and load the RAM disk component and the OS kernel component respectively into a second location and third location within the memory;
   wherein the step of identifying the loader component further comprises:
   retrieving the loader component from a location in the image file pointed by a default setting; or
   scanning the image file to acquire the location of the loader component in the image file, so as to retrieve the loader component from the location in the image file.

2. The method of claim 1, wherein the step of storing the image file into the storage device further comprising:
   receiving the image file from a remote source; and
   storing the image file into an operating system (O/S) partition of the storage device.

3. The method of claim 1, wherein the step of identifying the loader component further comprising:
   confirming the authenticity of the signature of the image file.

4. The method of claim 1, wherein the step of loading the loader component into the memory further comprising:
   retrieving, by a Unified Extensible Firmware Interface (UEFI) boot module, the loader component from the image file; and
   decoding and loading the loader component into the memory as a loader.

5. The method of claim 1, after the step of retrieving the OS kernel component and the RAM Disk component, further comprising:
   retrieving file system component from the image file; and
   loading file system in the memory through the RAM Disk.

6. The method of claim 5, further comprising:
   authenticating signatures of system services; and
   executing authenticated system services.

7. A computer system, comprising:
   a processor unit;
   a storage device storing an image file containing a loader component, a RAM disk component, and an OS kernel component; and
   a memory storing instructions executable by the processor unit which, when executed, cause the computer system to identify the loader component, load the loader component into a first location in the memory as a loader, and execute the loader to retrieve and load the RAM disk component and the OS kernel component from the image file respectively into a second location and a third location within the memory;
   wherein the instructions when executed, further cause the computer system to:
   retrieve the loader component from the location in the image file pointed by a default setting; or
   scan the image file to acquire the location of the loader component in the image file, so as to retrieve the loader component from the location in the image file.

8. The computer system of claim 7, wherein the image file is received from a remote source and stored in an operating system (O/S) partition of the storage device.

9. The computer system of claim 7, wherein the instructions stored in the memory and executed by the processor unit to identify and load the loader component into the memory is the processes of a Unified Extensible Firmware Interface (UEFI) boot module located in a firmware of the computer system.

10. The computer system of claim 7, wherein the loader component is loaded into the memory as a loader, and the loader authenticates a signature component of the image file before the OS kernel component and the RAM disk component is retrieved and loaded into the memory.

* * * * *